United States Patent [19]

Afian et al.

[11] Patent Number: 4,691,994
[45] Date of Patent: Sep. 8, 1987

[54] METHOD FOR A SOLAR CONCENTRATOR MANUFACTURING

[76] Inventors: Viktor V. Afian, ulitsa Sevaka, 2, kv. 13; Albert V. Vartanian, Aigestan-10, 2, kv. 57; Ruben G. Martirosian, ulitsa Shinararneri, 27, kv. 32, all of Erevan; Stanislav V. Ryabikov, pereulok Vasnetsova, 12, kv. 64, Moscow; Dmitry S. Strebkov, Kirovogradsky proezd, 3, korpus 1, kv. 17, Moscow; Eduard V. Tveryanovich, Malo-Kolkhoznaya ploschad, 1, kv. 90, Moscow, all of U.S.S.R.

[21] Appl. No.: 309,044
[22] Filed: Oct. 6, 1981
[51] Int. Cl.$^4$ ................................................. G03H 3/00
[52] U.S. Cl. ....................................... 350/320; 350/37; 126/451
[58] Field of Search ................ 136/214; 126/440, 451; 350/3.6, 3.7, 286, 3.83, 96.12, 96.13, 96.14, 96.19, 320; 250/563, 227, 228; 356/431

[56] References Cited

U.S. PATENT DOCUMENTS

| | | | |
|---|---|---|---|
| 3,800,298 | 3/1974 | Ogura et al. | 350/3.83 |
| 4,011,857 | 3/1977 | Rice . | |
| 4,021,267 | 5/1977 | Dettling . | |
| 4,054,356 | 10/1977 | Noguchi | 350/3.5 |
| 4,074,704 | 2/1978 | Gellert | 126/440 |
| 4,146,407 | 3/1979 | Litsenko et al. . | |
| 4,314,283 | 2/1982 | Kramer | 350/96.19 |
| 4,344,417 | 8/1982 | Malecek | 126/440 |
| 4,458,979 | 10/1984 | Ross | 350/3.71 |

FOREIGN PATENT DOCUMENTS 2629641 1/1978 Fed. Rep. of Germany .
2342558 of 0000 France .

OTHER PUBLICATIONS

Sincerbox, G. T., "Formation of Optical Elements by Holography", IBM Tech. Disclosure Bulletin, vol. 10, No. 3, Aug. 1967, pp. 267 & 268.
Collier et al., Optical Holography, Section 1.6, pp. 16–19, Academic Press, New York, 1971.
Thewlis, J. Concise Dictionary of Physics, 2nd Ed., pp. 339 and 380.
Reflecting Holograms by H. J. Caulfield, Handbook of Optical Holography Mir Publishers, Moscow, vol. I.
Holography by J. W. Goodman, Proceedings of the IEE, v. 59, No. 9, Sep. 1971 (special issue) New York.
Optical Holography by Robert J. Collier, Christoph B. Burckhardt, Lawrence H. Lin, pp. 280–282, 582.
Article "Ideal Prism Solar Concentrators", by D. R. Mills and J. E. Grutronich, Solar Energy, 1978, pp. 423–430.
Article "International Conference on the Use of Solar Energy-The Scientific Basis", Transactions of the Conference, vol. II, Part 1, Section B, pp. 213, 214.
Article "Optical Holography", by Robert J. Collier et al., Academic Press, 1971, pp. 44–47.

*Primary Examiner*—Bruce Y. Arnold
*Attorney, Agent, or Firm*—Fleit, Jacobson, Cohn & Price

[57] ABSTRACT

A method of manufacturing a solar concentrator employing a prism having a radiation input face, a reflection face and at least one radiation output face. The method comprises the steps of providing the prism with its reflection face angularly disposed with respect to the input face. A layer of light-sensitive material is deposited on the input face of the prism. An auxiliary prism and a substance having a refractive index close to that of the light-sensitive material is provided with the substance placed between the light-sensitive material and the auxiliary prism. Next, an interference pattern is recorded in the light-sensitive layer to obtain a three dimensional hologram. This is accomplished by using a reference laser beam and an object laser beam. The reference laser beam is sent to the light-sensitive layer via the auxiliary prism and the substance in the direction of propagation of the incident radiation to be concentrated. The object laser beam is directed via the auxiliary prism at an angle with respect to the light-sensitive layer such that fringe planes are formed in the light-sensitive layer in order to diffract incident radiation at the angle. The auxiliary prism and the substance are removed, and the light-sensitive layer is developed. The angular relationship between the reflection face, the input face and the angle are chosen to preclude the diffraction of a beam which has been reflected from the reflection face.

2 Claims, 1 Drawing Figure

METHOD FOR A SOLAR CONCENTRATOR MANUFACTURING

FIELD OF THE INVENTION

The invention relates to optics, more particularly to a manufacturing method for a solar concentrator.

The solar concentrator made by the subject of the present invention may be used in solar power engineering for concentrating solar radiation striking the working surface of a photoconverter.

BRIEF DESCRIPTION OF THE INVENTION

A method of making a solar concentrator having no images of radiation sources and providing more uniform distribution of energy on its output surface is of great interest at this time in the field of solar power engineering.

Accordingly, it is an object of the present invention to provide a method of manufacturing a solar concentrator that employs a prism having a radiation input face, a reflection face and at least one radiation output face. The method comprises the steps of providing the prism with the reflection face angularly disposed with respect to the input face, depositing a layer of light-sensitive material on the input face of the prism, providing an auxiliary prism and a substance having a refractive index close to that of the light-sensitive material and placing the substance between the light-sensitive material and the auxiliary prism, recording an interference pattern to obtain a three dimensional hologram in the light-sensitive layer by the use of a reference laser beam and an object laser beam by sending the reference laser beam to the light-sensitive layer via the auxiliary prism and the substance in the direction of propagation of the incident radiation to be concentrated and by directing the object laser beam via the auxiliary prism at an angle with respect to the light-sensitive layer such that fringe planes are formed in the light-sensitive layer in order to diffract incident radiation at the angle, removing the auxiliary prism and the substance; and developing the light-sensitive layer wherein the angular relationship between the reflection face, the input face and the angle are chosen to preclude the diffraction of a beam which has been reflected from the reflection face.

BRIEF DESCRIPTION OF THE DRAWING

The invention will now be described further with reference to a specific preferred embodiment thereof, taken in conjunction with the accompanying drawing, wherein.

DETAILED DESCRIPTION OF THE INVENTION

Figure 1:
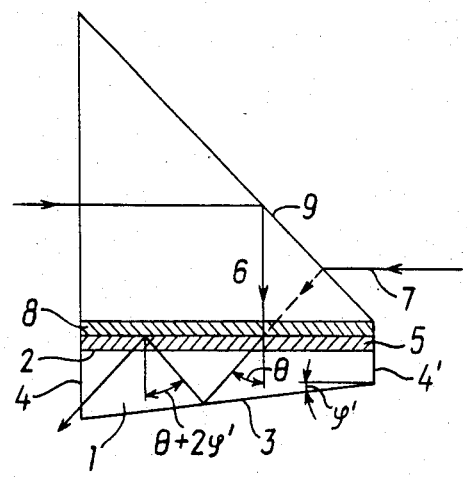
FIG. 1 shows the inventive method for making a solar concentrator comprising a prism with a trapezoidal base and a three-dimensional transmission hologram on an input face according to the invention.

The method of making a solar concentrator forming the subject of the present invention is illustrated in FIG. 1. The solar concentrator comprises a prism 1 with a trapezoidal base and input and reflection faces 2, 3, respectively, two output faces 4, 4', and a layer 5 of material in which is formed a three-dimensional transmission hologram. The faces 2 and 3 are the non-parallel faces of the prism 1 and the reflection face 3 is angularly disposed with respect to the input face 2. The parameters of the diffraction grating of the hologram assure that, with the concentrator struck by a beam of light similar to reference laser beam 6, it enters the prism at an angle $\theta$ and is propagated via total interval reflection within the prism towards the output face 4. A dashed line shows the direction of an object laser beam 7 in the prism 1 when the diffraction grating of the three-dimensional hologram is formed.

The herein proposed method for manufacturing the solar concentrator of FIG. 1 comprises the following steps. A layer 5 of a suitable light-sensitive material, say a photoemulsion, is deposited on the input face 2 of the prism 1. The light-sensitive layer 5 is then topped with a layer 8 of an immersion liquid substance with a reflective index close to that of the light-sensitive material 5, and an auxiliary prism 9 is placed thereon. A three-dimensional hologram is formed in the light sensitive layer 5 by recording an interference pattern through the use of a reference laser beam 6 and an object layer beam 7. The auxiliary prism 9 routes the reference laser beam 6 through the layer 8 in the direction of propagation of the incident radiation to be concentrated and directs the object laser 7 via the auxiliary prism at the angle $\theta$ and with respect to the light sensitive layer 5 such that fringe planes are formed in the light-sensitive layer 5 in order to diffract incident radiation at that angle. The auxiliary prism 9 and substance 8 are then removed and the light sensitive layer 5 is developed. The angular relationship between the reflection face 3, the input face 2 and the angle $\theta$ are chosen to preclude the diffraction of a beam which has been reflected from the reflection face 3.

The special characteristics of the concentrator may be varied within wide limits with the trapezoidal prism 1. In production of such a concentrator the object laser beam 7 is directed to the prism 1 at an angle randomly chosen to be larger than the critical angle of the material of the prism in air. The object laser beam 7 represents light radiation with a flat wave-front. Respectively, the angle $\phi'$ between the input and reflection faces 2 and 3 may be chosen in the range from 45° to $\delta/2$, where $\delta$ is angular deviation from the Bragg angle at which diffraction efficiency of the three-dimensional hologram is minimum. To obtain high concentration of the light radiation, the angle $\phi'$ should advantageously be equal to $\delta/2$. The object laser beam 7 will then be bent to the prism 1 in the direction of the output face 4.

The concentrator operates in the following manner. Light radiation similar to the reference beam 6 strikes the layer 5 of light-sensitive material with the three-dimensional transmission hologram formed therein, gets diffracted therein and enters the prism 1 at an angle $\theta$ of total internal reflection. After reflection from the reflection face 3 inclined at an angle $\phi'$ with respect to the input face 2, the beam reaches the volume hologram-air interface at the angle $\theta + 2\phi'$ and is subjected to total internal reflection. The angle $\phi'$ is chosen to be equal to at least a half of angular deviation from the Bragg angle at which diffraction efficiency of the hologram is zero. Since the beam reflected from the volume hologram-air interface meets the dispersing surfaces of the volume hologram with deviation from the Bragg angle equaling $2\phi'$ at which diffraction efficiency of said hologram is zero, it will not be diffracted therein. Thus, the direction of the beam will not change and it will come out through the output face 4 after a series of reflections.

The scope of the invention is not limited to the specific embodiment described. The preferred embodiment illustrates a method of making of a novel solar concentrator based on the utilization of three-dimensional holograms and the total internal reflection effect.

The method of making a solar concentrator in compliance with the invention permits obtaining increased concentration as compared with prior art concentrators utilizing a prism with total internal reflection. The method of manufacturing the concentrator according to the invention allows fabricating solar concentrators over a fairly wide spectral selectivity range: from narrow-band concentrating filters with a spectrum region several nanometers wide to concentrators which do not virtually possess spectral selectivity. The concentrator forming the subject of the present invention is constructionally simple and has a minimum number of elements. It also boasts of operational reliability. The method of manufacturing said concentrator saves labor in mechanical treatment thereof and comprises a minimum number of steps, which is generally a time-saving factor for production process takes just a few minutes.

What is claimed is:

1. A method of manufacturing a solar concentrator employing a prism having a radiation input face, a reflection face and at least one radiation output face, said method comprising the steps of:

providing said prism with said reflection face angularly disposed with respect to said input face;

depositing a layer of light-sensitive material on said input face of the prism;

providing an auxiliary prism and a substance having a refractive index close to that of said light-sensitive material and placing said substance between said light-sensitive material and said auxiliary prism;

recording an interference pattern to obtain a three dimensional hologram in said light-sensitive layer by the use of a reference laser beam and an object laser beam by sending said reference laser beam to said light-sensitive layer via said auxiliary prism and said substance in the direction of propagation of the incident radiation to be concentrated and by directing said object laser beam via said auxiliary prism at an angle with respect to said light-sensitive layer such that fringe planes are formed therein in order to diffract said incident radiation at said angle;

removing said auxiliary prism and said substance; and developing said light-sensitive layer;

wherein the angular relationship between said reflection face, said input face and said angle are chosen to preclude the diffraction of a beam which has been reflected from said reflection face.

2. A method of manufacturing a solar concentrator as claimed in claim 1, wherein said prism has a trapezoidal base and said object laser beam is light radiation with a flat wave-front, which is directed to one of said faces of said prism which act as said radiation input and reflection faces.

* * * * *